United States Patent
Lu et al.

(10) Patent No.: US 10,756,085 B2
(45) Date of Patent: Aug. 25, 2020

(54) INTEGRATED CIRCUIT WITH METAL GATE HAVING DIELECTRIC PORTION OVER ISOLATION AREA

(71) Applicant: QUALCOMM Incorporated, San Diego, CA (US)

(72) Inventors: Ye Lu, San Diego, CA (US); Bin Yang, San Diego, CA (US); Lixin Ge, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/835,810

(22) Filed: Dec. 8, 2017

(65) Prior Publication Data

US 2019/0181137 A1   Jun. 13, 2019

(51) Int. Cl.
*H01L 27/088*      (2006.01)
*H01L 27/06*       (2006.01)
(Continued)

(52) U.S. Cl.
CPC ........ *H01L 27/0688* (2013.01); *G06F 30/398* (2020.01); *H01L 21/7624* (2013.01); *H01L 21/76898* (2013.01); *H01L 21/823431* (2013.01); *H01L 21/823437* (2013.01); *H01L 21/823821* (2013.01); *H01L 27/088* (2013.01);
(Continued)

(58) Field of Classification Search
CPC ............. H01L 27/0924; H01L 27/0886; H01L 21/823821; H01L 21/823431; H01L 21/823878; H01L 21/82385; H01L 21/823456; H01L 21/823828; H01L 21/823437
See application file for complete search history.

(56) References Cited

U.S. PATENT DOCUMENTS 9,748,245 B1 * 8/2017 Cheng ................. H01L 27/1104
2007/0111419 A1 * 5/2007 Doyle ............. H01L 21/823807
438/197

(Continued)

FOREIGN PATENT DOCUMENTS

EP   0991114 A2   4/2000
EP   3244447 A1   11/2017

OTHER PUBLICATIONS

International Search Report and Written Opinion—PCT/US2018/061221—ISA/EPO—dated Jan. 31, 2019.

*Primary Examiner* — Michael M Trinh
(74) *Attorney, Agent, or Firm* — Withrow & Terranova, PLLC

(57) ABSTRACT

An integrated circuit may include a substrate, a first three-dimensional (3D) transistor formed on a first diffusion region of the substrate, and a second 3D transistor formed on a second diffusion region of the substrate. The first 3D transistor may include a gate that extends from between a source and a drain of the first 3D transistor, across an isolation region of the substrate, to and between a source and a drain of the second 3D transistor. The gate may include a gate metal that has an isolation portion extending over the isolation region of the substrate and a diffusion portion extending over the first and second diffusion regions of the substrate. The isolation portion of the gate metal has a thickness less than a maximum thickness of the diffusion portion of the gate metal.

8 Claims, 10 Drawing Sheets

(51) Int. Cl.

| | |
|---|---|
| *H01L 21/768* | (2006.01) |
| *H01L 21/8238* | (2006.01) |
| *H01L 21/762* | (2006.01) |
| *H03K 19/0185* | (2006.01) |
| *H01L 21/8234* | (2006.01) |
| *G06F 30/398* | (2020.01) |
| *H01L 27/092* | (2006.01) |

(52) U.S. Cl.
CPC . *H01L 27/0886* (2013.01); *H03K 19/018571* (2013.01); *H01L 21/823481* (2013.01); *H01L 21/823828* (2013.01); *H01L 21/823878* (2013.01); *H01L 27/0924* (2013.01)

(56) References Cited

U.S. PATENT DOCUMENTS

| | | | |
|---|---|---|---|
| 2008/0157365 A1 | 7/2008 | Ott et al. | |
| 2008/0296702 A1* | 12/2008 | Lee | H01L 21/823431 257/401 |
| 2013/0140639 A1* | 6/2013 | Shieh | H01L 21/823412 257/368 |
| 2014/0151801 A1* | 6/2014 | Haran | H01L 21/845 257/347 |
| 2015/0162419 A1* | 6/2015 | Li | H01L 29/66545 438/585 |
| 2016/0079354 A1* | 3/2016 | Park | H01L 27/0886 257/386 |
| 2016/0365453 A1* | 12/2016 | Kim | H01L 29/7856 |
| 2017/0018620 A1 | 1/2017 | Liu et al. | |
| 2019/0067417 A1* | 2/2019 | Ching | H01L 29/66545 |

\* cited by examiner

INTEGRATED CIRCUIT WITH METAL GATE HAVING DIELECTRIC PORTION OVER ISOLATION AREA

BACKGROUND

Field

Aspects of the present disclosure relate to semiconductor devices, and more particularly to reducing gate to contact parasitic capacitance in integrated circuits having three-dimensional (3D) transistors.

Background

Transistors are essential components in modern electronic devices. Large numbers of transistors are employed in integrated circuits (ICs) in many modern electronic devices. For example, components such as central processing units (CPUs) and memory systems employ large quantities of transistors for logic circuits and memory devices.

As electronic devices continue to become more functionally complex, the need to include more transistors in such devices increases. This increase is achieved in part through continued efforts to miniaturize transistors in ICs (i.e., placing more transistors into the same amount of space). Part of that effort has included moving from planar transistors to 3D transistors, such as Fin Field-Effect Transistors (FinFETs). FIG. 1 illustrates an example FinFET 100. As shown in FIG. 1, the FinFET 100 includes a conduction channel 102 in the form of a "fin" 104. The fin 104 is formed in a substrate 106 of a semiconductor material and has two vertical side surfaces 108 and a horizontal top surface 110. Applying a voltage to a gate 112 wrapped around the two vertical side surfaces 108 and the horizontal top surface 110 generates an electric field in the fin 104 that allows current to flow from a source 114 to a drain 116.

Multiple FinFETs, like FinFET 100 in FIG. 1, may be implemented in an integrated circuit or in a complementary metal-oxide semiconductor (MOS) (CMOS) standard cell, for example. A CMOS standard cell provides a standard layout of P-type MOS (PMOS) and N-type (NMOS) regions and structures for fabricating transistors and interconnect structures to form circuits, including logic circuits. For example, FIG. 2 illustrates a 10 nm node size CMOS standard cell 200. The 10 nm CMOS standard cell 200 has six (6) fins 202(1)-202(6) positioned between two (2) power supply rails 204(1), 204(2), that can form a fin in a fabricated FinFET. For example, a FinFET could be formed in each PMOS and NMOS region 206, 208 of the CMOS standard cell 200. The PMOS region 206 is separated from the NMOS region 208 of the 10 nm CMOS standard cell 200 by an isolation region 220. Each FinFET formed in the 10 nm CMOS standard cell 200 could employ two (2) outer fins 202(1), 202(2) and 202(5), 202(6) to form their respective channel structures. The fins 202(1)-202(6) of each FinFET of the CMOS standard cell could be connected to one of a source/drain line 210(1)-210(5) acting as a source and one of a source/drain line 210(1)-210(5) acting as a drain, and be controlled by a gate contact 212(1)-212(2) over one of the four (4) gate lines 214(1)-214(4) of the CMOS standard cell acting as a gate of each FinFET.

The gate lines 214(1)-214(4) include a gate metal that can extend from one FinFET in the PMOS region 206 over the isolation region 220 to a FinFET in the NMOS region 208 of the 10 nm CMOS standard cell 200. When the gate extends across the isolation region 220, the gate metal may couple to the end of the source and drain contacts of a proximate FinFETs and create three-dimensional (3D) parasitic capacitances. In advanced CMOS technologies (e.g., 7 nm and beyond), these 3D parasitic capacitances factor prominently and can adversely impact chip performance.

SUMMARY

An integrated circuit may include a substrate, a first three-dimensional (3D) transistor, and a second 3D transistor. The first 3D transistor may be formed on a first diffusion region of the substrate and may include a first source, a first drain, and a gate extending across the first diffusion region between the first source and the first drain. The second 3D transistor may be formed on a second diffusion region of the substrate and may include a second source, a second drain, and the gate extending across the second diffusion region between the second source and the second drain. The gate may extend from the first 3D transistor across an isolation region of the substrate to the second 3D transistor. The gate may include a gate metal, which may have an isolation portion that extends over the isolation region of the substrate and a diffusion portion that extends over the first diffusion region and the second diffusion region. The isolation portion of the gate metal may have a thickness less than a maximum thickness of the diffusion portion of the gate metal.

A method of making an integrated circuit may include providing a wafer substrate having a plurality of partially formed 3D transistors thereon. The plurality of partially formed 3D transistors has completed fin formation and gate metal deposition, depositing a gate metal over a first diffusion region of the wafer substrate, across an isolation region of the wafer substrate, and over a second diffusion region of the wafer substrate to connect a first partially formed 3D transistor to a second partially formed 3D transistor. The method may further include selectively etching the gate metal to remove a portion of the gate metal in the isolation region of the wafer substrate and depositing a gate dielectric material in the isolation region of the wafer substrate to fill in the portion of the gate metal that was removed. The method may further include polishing a top surface of the gate metal on the first diffusion region and the second diffusion region to be flush with a top surface of the gate dielectric material, and depositing additional gate metal on the previously deposited gate metal and the gate dielectric material to extend from the first partially formed 3D transistor to the second partially formed 3D transistor.

A method of making an integrated circuit may include providing a wafer substrate having a plurality of partially formed 3D transistors thereon. The plurality of 3D transistors has completed fin formation and are covered by a poly silicon, the poly silicon covering a plurality of fins disposed over a first diffusion region of the wafer substrate, across an isolation region of the wafer substrate, and over a second diffusion region of the wafer substrate. The method may further include selectively etching the poly silicon to remove a portion of the poly silicon in the isolation region of the wafer substrate, and depositing a gate dielectric material in the isolation region of the wafer substrate to fill in the portion of the poly silicon that was removed. The method may further include polishing a top surface of the gate dielectric material to be flush with a top surface of the poly silicon, and removing the poly silicon from the first diffusion region and the second diffusion region of the wafer. The method may further include depositing a gate metal over the plurality of fins disposed over the first diffusion region of the wafer substrate, the gate dielectric material extending over the isolation region of the wafer substrate, and the plurality of fins disposed over the second diffusion region of the wafer substrate.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

According to aspects of the present disclosure, a dielectric material may be provided to at least partially replace a gate metal over an isolation region of a substrate. The advantages of replacing a portion of the gate metal over the isolation region with a dielectric material include reducing gate to contact parasitic capacitance by approximately 70% and improving chip performance by as much as 5-10%.

Figure 1:
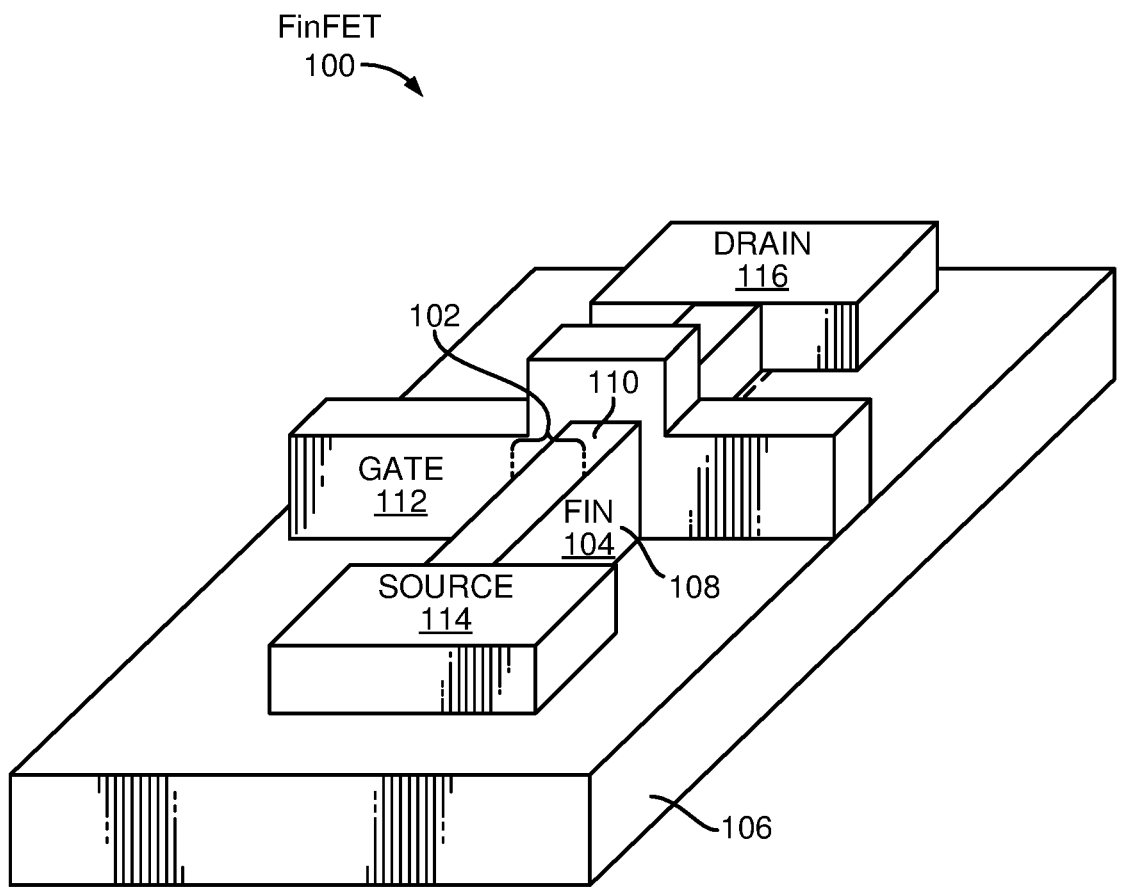
FIG. 1 a perspective diagram of an exemplary Fin Field-Effect Transistor (FinFET).
Figure 2:
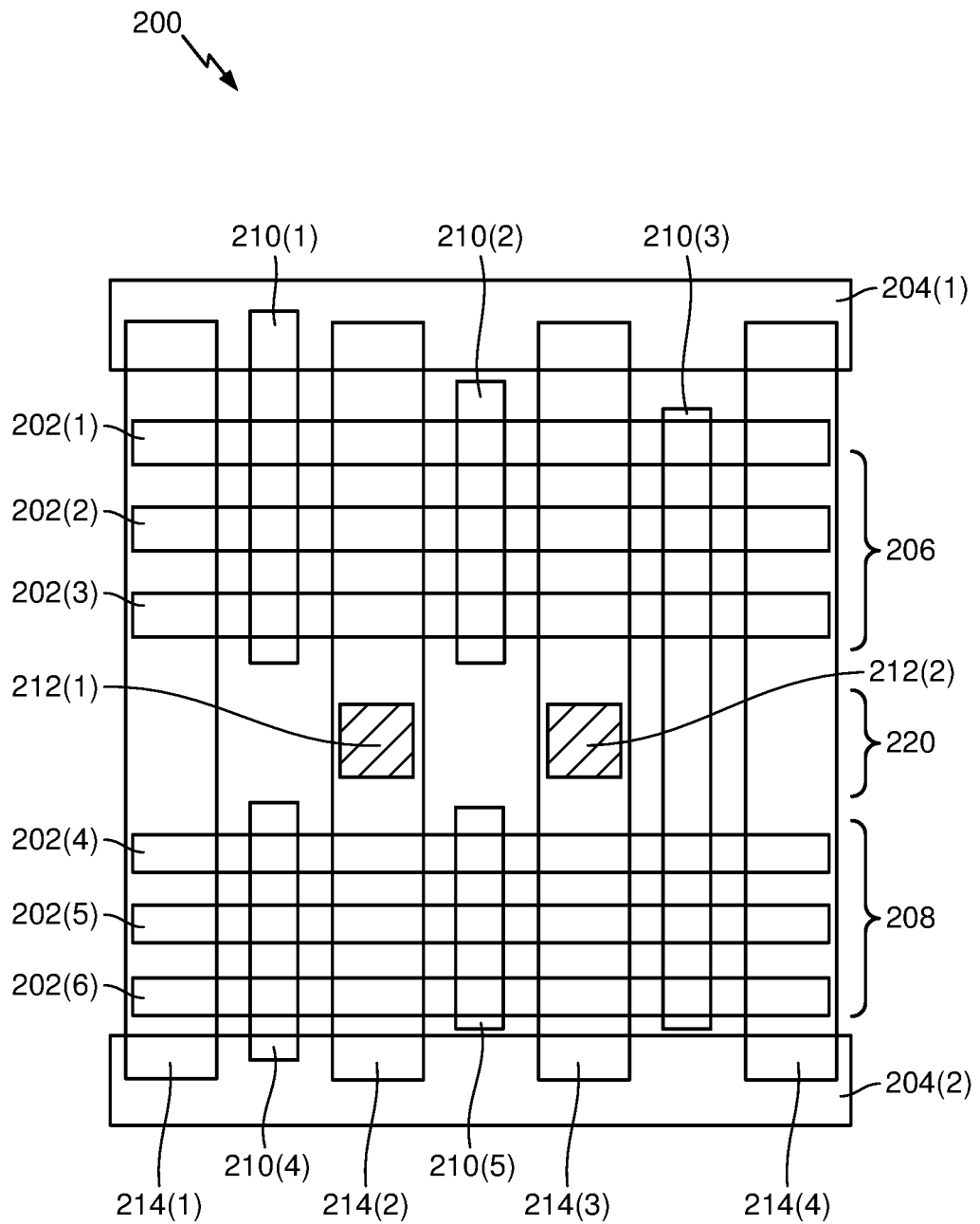
FIG. 2 illustrates a top view of an exemplary ten (10) nanometer (nm) standard cell.
Figure 3A:
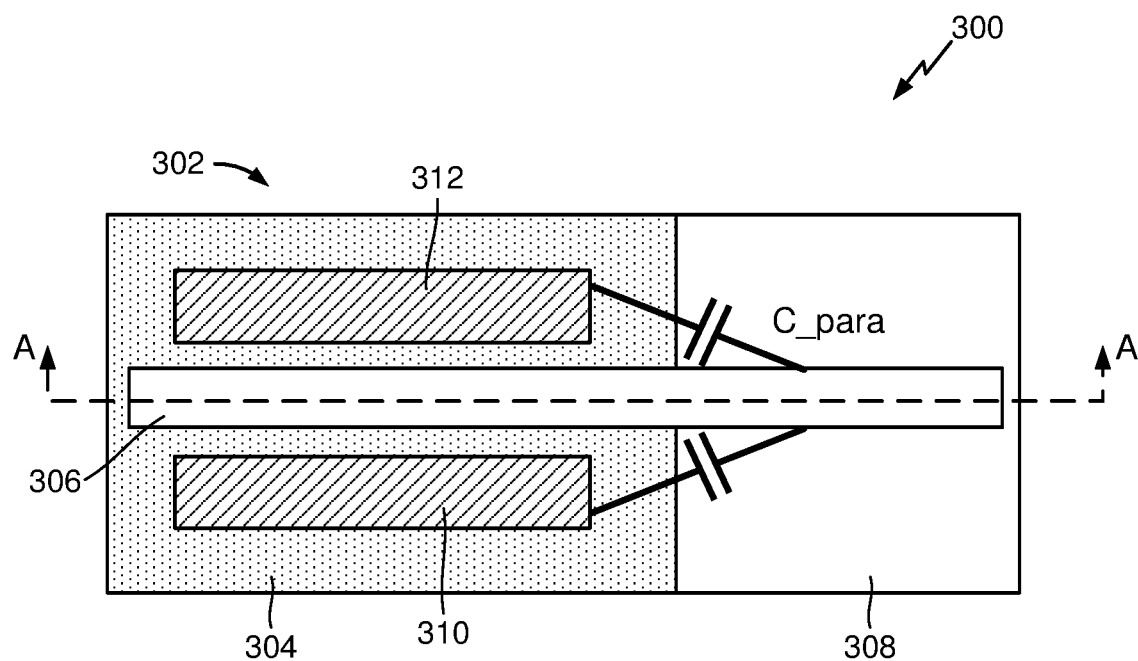
FIG. 3A is a top plan view of a portion of an integrated circuit (IC) showing parasitic capacitances that may result from gate over isolation region coupling to source and/or drain contact ends.
Figure 3B:
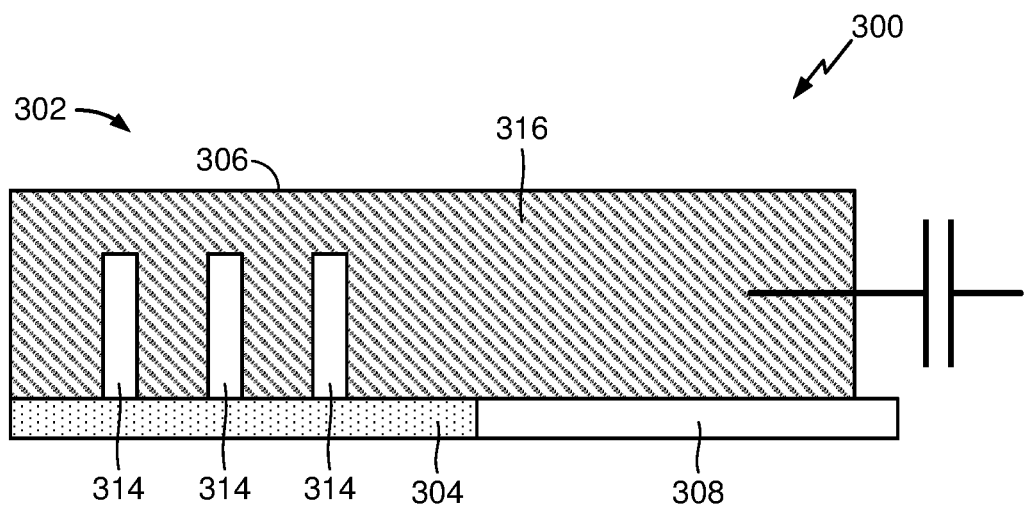
FIG. 3B is a cross-sectional diagram taken generally along the line A-A of FIG. 3A.

FIGS. 3A and 3B illustrate a simplified view of a portion of a conventional IC 300 having a 3D transistor, such as FinFET 302 disposed on a diffusion region 304 of a substrate. The FinFET 302 includes a gate 306 that extends from the FinFET 302, across an isolation region 308 of the substrate, to another FinFET (not shown). By way of example, FinFET 302 may be a FinFET that is formed in the PMOS region 206 of the 10 nm CMOS standard cell 200 shown in FIG. 2, with gate 306 shown as one of the gate lines 214(1)-214(4), extending to a FinFET in another region, such as NMOS region 208. The FinFET 302 includes a source 310, a drain 312, and a plurality of fins 314, that are wrapped around by the gate 306. The gate 306 includes a gate metal 316. When the gate 306 extends across the isolation region 308 of the substrate, the gate metal 316 can couple to the end of the contacts of the source 310 and the drain 312, causing a 3D coupling parasitic capacitance. In advanced CMOS technologies (e.g., 7 nm and beyond), 3D parasitic capacitance factors prominently and can adversely impact chip performance.

Figure 4A:
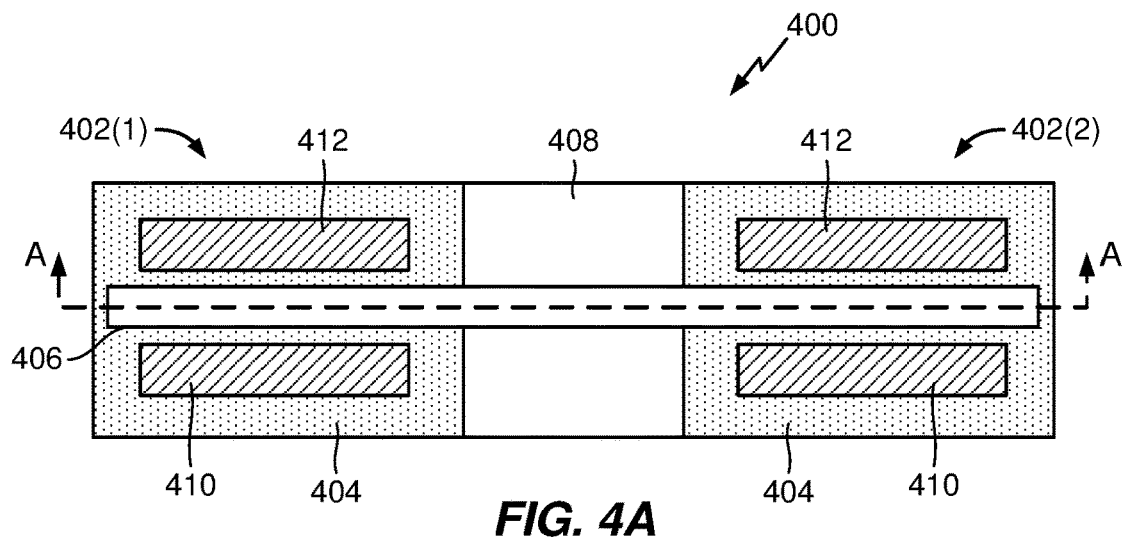
FIG. 4A is a top plan view of a portion of an IC, according to aspects of the present disclosure.
Figure 4B:
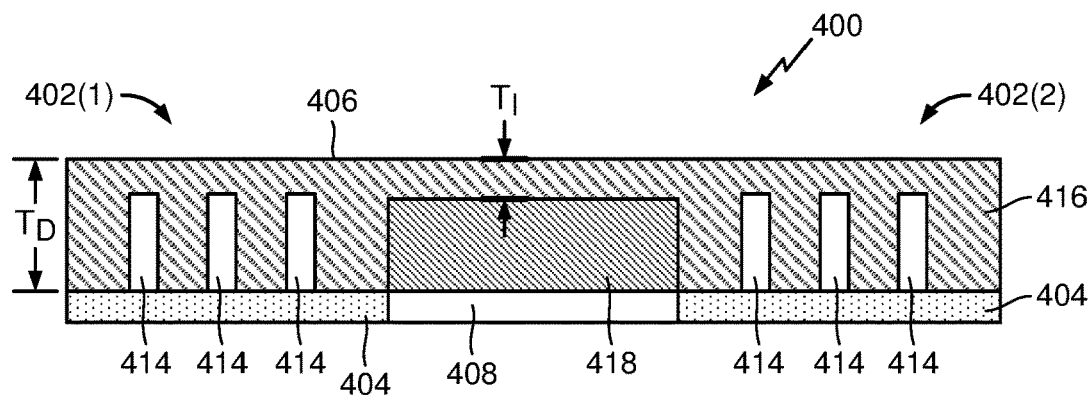
FIG. 4B is a cross-sectional diagram taken generally along the line A-A of FIG. 4A.

To reduce 3D parasitic capacitances, according to aspects of the present disclosure, an IC may be provided, in which a portion of a gate that extends over an isolation region of a substrate is replaced with a dielectric material, thereby reducing coupling between the gate and any source and/or drain contacts of proximate FinFETs. FIGS. 4A and 4B illustrate a portion of an IC 400 having 3D transistors, such as FinFETs 402(1), 402(2) disposed on a diffusion region 404 of a substrate. The FinFET 402(1) includes a gate 406 that may extend from the FinFET 402(1), across an isolation region 408 of the substrate, to the FinFET 402(2). By way of example, like FinFET 302 of FIGS. 3A and 3B, the FinFET 402(1) may be a FinFET that is formed in the PMOS region 206 of the 10 nm CMOS standard cell 200 shown in FIG. 2, and FinFET 402(2) may be a FinFET that is formed in the NMOS region 208 of the 10 nm CMOS standard cell 200, with gate 406 shown as one of the gate lines 214(1)-214(4) from the PMOS region 206 to the NMOS region 208. Each of the FinFETs 402(1), 402(2) includes a source 410, a drain 412, and a plurality of fins 414, that are wrapped around by the gate 406. The gate 406 includes a gate metal 416, which may be composed of a conducting metal, such as cobalt or tungsten.

The IC 400 is similar to the IC 300 shown in FIGS. 3A and 3B, except that the gate metal 416 has a reduced thickness over the isolation region 408 of the substrate, because a portion of the gate metal over the isolation region 408 has been replaced by a gate dielectric material 418. The portion of the gate metal 416 that extends over the isolation region 408 has a thickness $T_I$ that is less than a maximum thickness $T_D$ of the gate metal 416 over the diffusion region 404. By way of example, the gate metal 416 may have an isolation region thickness $T_I$ in the range of 10 nm to 35 nm and over the diffusion region 404 a maximum thickness $T_D$ in the range of 50 nm to 80 nm.

The gate dielectric material 418 may be a silicon nitride or any other suitable dielectric material, including a combination of dielectric materials. The gate dielectric material 418, which is disposed between the isolation region 408 of the substrate and the gate metal 416, may have a thickness in the range of 40 nm to 60 nm. As mentioned above, the gate dielectric material 418 replaces a portion of the gate metal 416 over the isolation region 408 of the substrate, thereby reducing the 3D parasitic coupling capacitance of the gate metal 416 over the isolation region 408 to the contacts of the source 410 and the drain 412 of neighboring FinFETs, such as FinFET 402. This reduction in 3D parasitic capacitance will improve the performance of advanced CMOS devices.

Figure 4C:
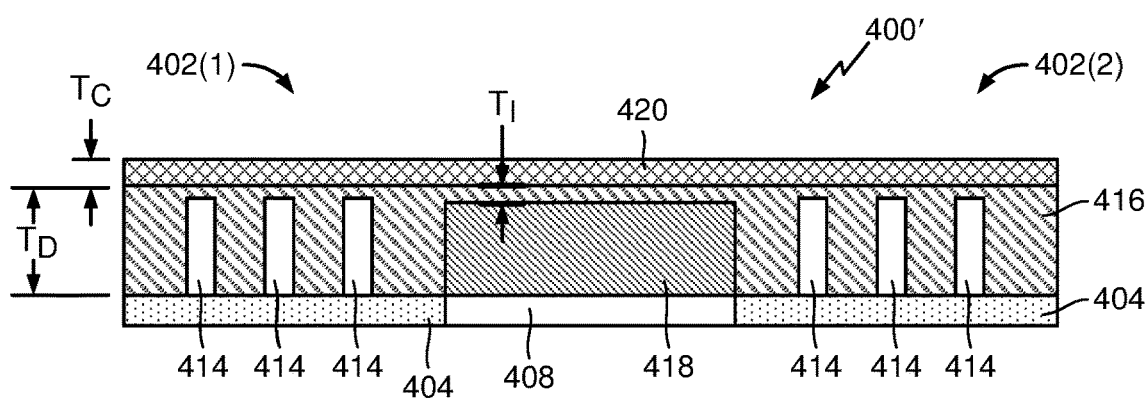
FIG. 4C is a cross-sectional diagram taken generally along the line A-A of FIG. 4A, according to another aspect of the present disclosure.

According to aspects of the present disclosure, an optional conducting layer may further be provided on the gate metal 416. FIG. 4C illustrates an IC 400' similar to the IC 400 in FIG. 4B, however, the IC 400' includes a conducting layer 420 disposed on the gate metal 416. All other components of IC 400' are similar to those shown in FIG. 4B and thus are identified by the same reference numerals.

The conducting layer 420 may be composed of a material having a higher conductivity than the gate metal 416 to improve gate conductance. For example, if the gate metal 416 is made of tungsten or cobalt, the conducting layer may be composed a carbon material, such as graphene. Other suitable materials for the conducting layer 420 that have a higher conductivity than tungsten or cobalt include silver, copper, gold, aluminum and calcium. The conducting layer 420 may have a thickness $T_C$ in the range of 10 nm to 30 nm.

Figure 5:
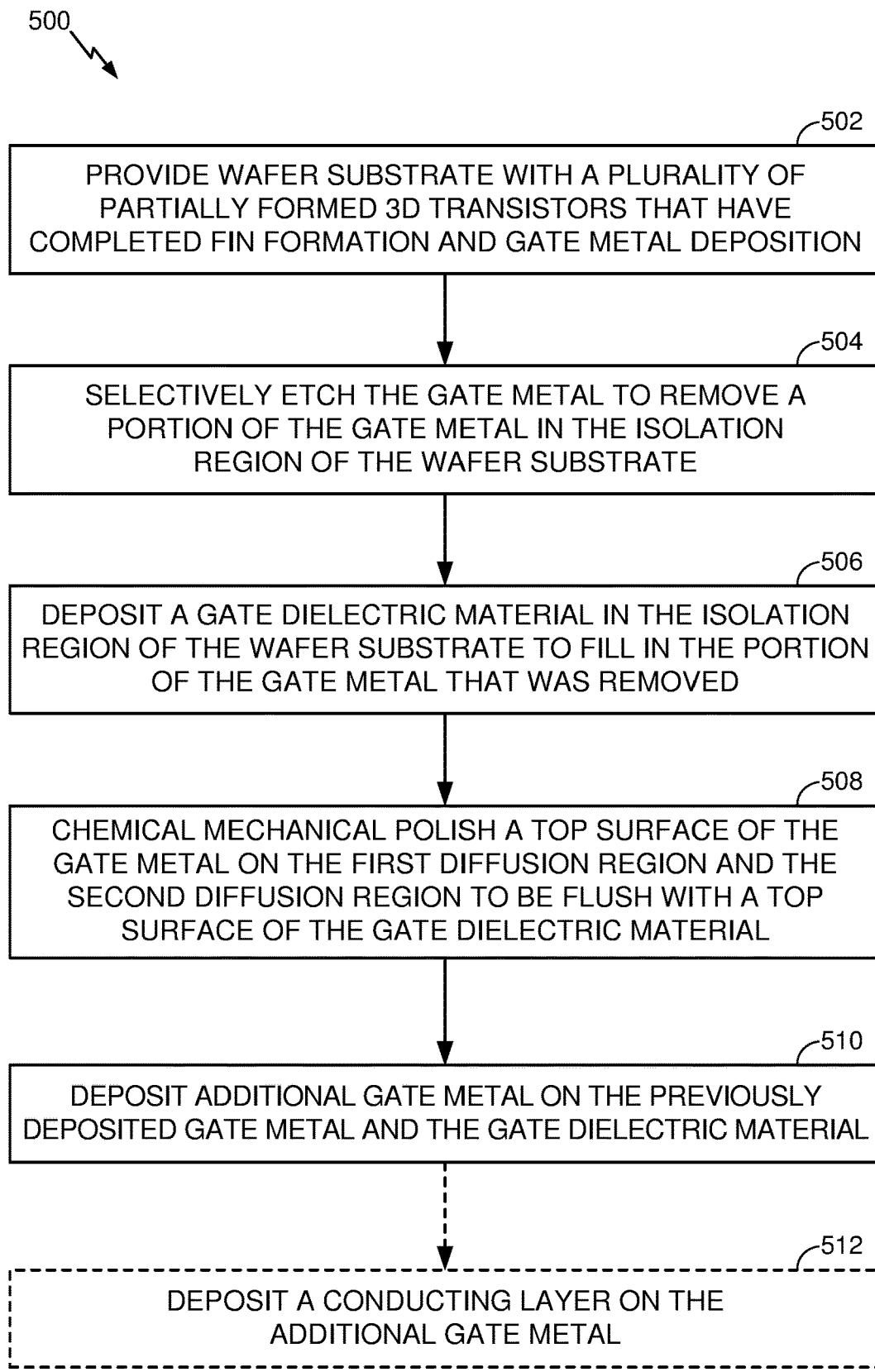
FIG. 5 illustrates a process flow diagram of a method for fabricating an IC device, according to aspects of the present disclosure.
Figure 6A:
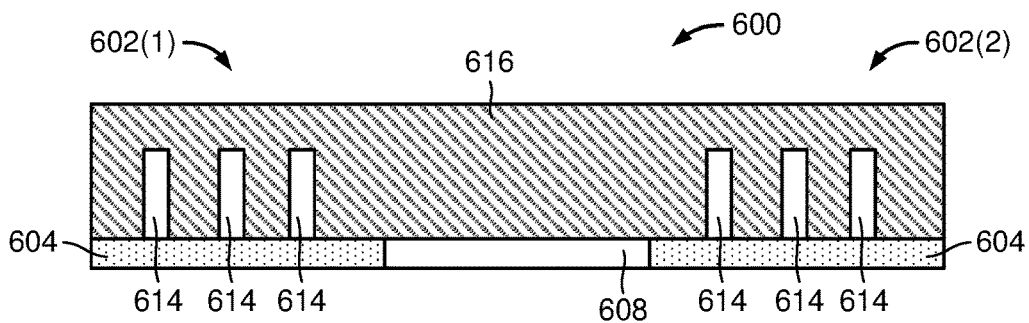
FIGS. 6A-6E illustrate a fabrication process for fabricating an IC device, according to aspects of the present disclosure.

FIG. 5 provides a process flow diagram of a method 500 for fabricating an IC device, according to aspects of the present disclosure. The process flow diagram of FIG. 5 may be supplemented by the fabrication process illustrations of FIGS. 6A-6E. At block 502 a wafer substrate having a plurality of partially formed 3D FinFET transistors that have completed fin formation and gate metal deposition is provided. As illustrated in FIG. 6A, a wafer substrate 600 may have partially formed 3D transistors 602(1), 602(2) formed thereon. The partially formed 3D transistors 602(1), 602(2) are each formed on a diffusion region 604 of the wafer substrate 600, and each of the partially formed 3D transistors 602(1), 602(2) includes a plurality of fins 614. The diffusion regions 604 of the wafer substrate 600 are separated from each other by an isolation region 608 of the wafer substrate 600. The wafer substrate 600 has completed gate formation, so a gate metal 616, which may be composed of tungsten or cobalt, is provided over the fins 614 of the partially formed 3D transistors 602(1), 602(2). The gate metal 616 extends from the diffusion region 604 of one partially formed 3D transistor 602(1), across the isolation region 608 of the wafer substrate, to the diffusion region 604 of another partially formed 3D transistor 602(2), thereby connecting the partially formed 3D transistor 602(1) to the partially formed 3D transistor 602(2).

Figure 6B:
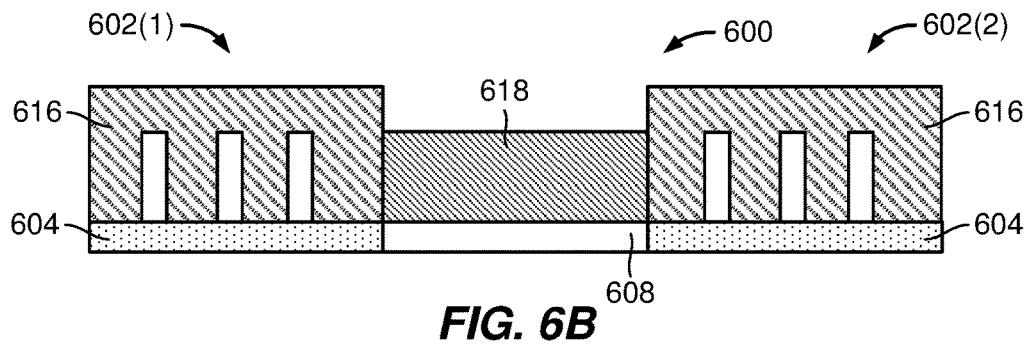

At block 504 of FIG. 5, the gate metal 616 may be selective etched to remove a portion of the gate metal in the isolation region 608 of the wafer substrate 600. At block 506 a gate dielectric material may then be deposited in the isolation region 608 of the wafer substrate 600 to fill in the portion of the gate metal 616 that was removed in block 504. As shown in FIG. 6B, the gate metal 616 has been selectively removed from the isolation region 608 of the wafer substrate 600 and replaced with a gate dielectric material 618. The gate dielectric material 618 may have at thickness in the range of 40 nm to 60 nm. As noted earlier, the gate dielectric material 618 may be a silicon nitride or any other suitable dielectric material.

Figure 6C:
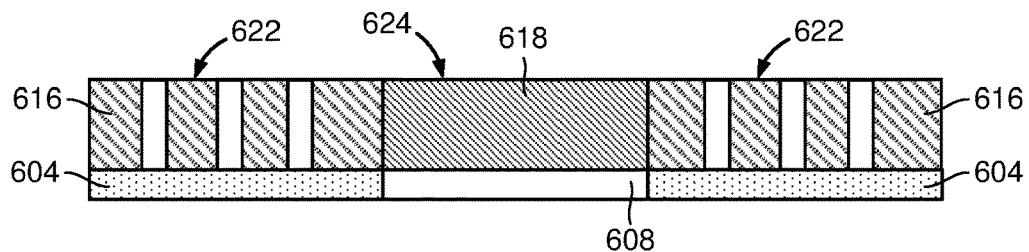

At block 508 of FIG. 5, the gate metal 616 may be chemical mechanically polished to level out the gate metal 616, such that a top surface of the gate metal 616 is flush with a top surface of the gate dielectric material 618. As shown in FIG. 6C, as a result of the chemical mechanical polish, a top surface 622 of the gate metal 616 is flush, or co-planar, with a top surface 624 of the gate dielectric material 618.

Figure 6D:
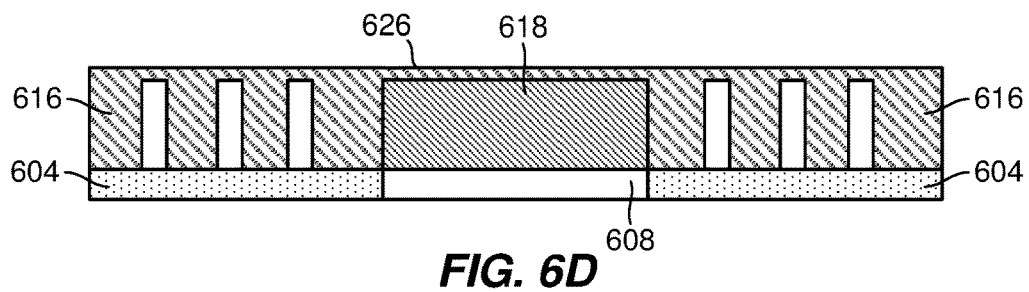

At block 510 of FIG. 5, additional gate metal may then be deposited on the top surface 622 of the previously deposited gate metal 616 and the top surface 624 of the gate dielectric material 618. As shown in FIG. 6D, an additional layer 626 of gate metal is provided on top of the previously deposited gate metal 616 and the gated dielectric material 618. The additional layer 626 of gate metal may be preferably composed of the same material as the gate metal 616.

The thickness of the additional layer 626 of gate metal may vary, depending on whether the gate will include an optional conducting layer on top of the gate metal. If no conducting layer will be added to the gate, the additional layer 626 of gate metal may, for example, have a thickness in the range of 10 nm to 35 nm. If a conducting layer will be added to the gate, then the additional layer 626 of gate material may, for example, be a thin layer having a thickness in the range of 1 nm to 5 nm.

Figure 6E:
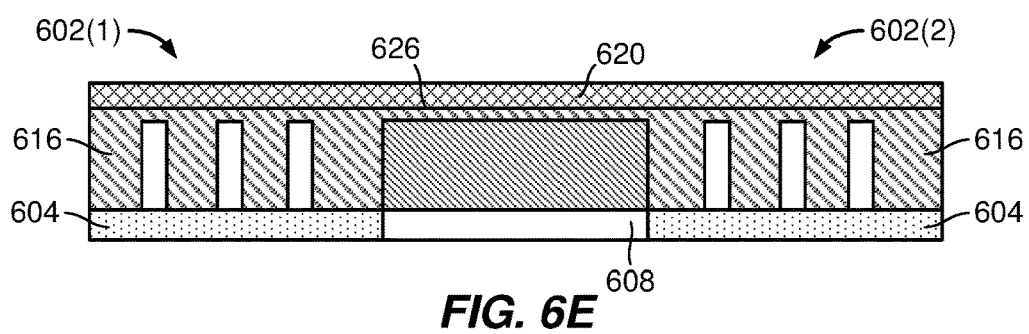

At block 512 of FIG. 5, an optional conducting layer may be deposited on the additional gate metal. The conducting material may be either deposited or grown on the top of the gate material in both the diffusion and isolation regions to form a conducting path of the gate. The conducting layer is preferably composed of material having a higher conductivity than that the gate metal. For example, if the gate metal is composed of tungsten or cobalt, the conducting layer may be composed of a carbon material, such as graphene. Other suitable materials for the conducting layer that have a higher conductivity than tungsten or cobalt include silver, copper, gold, aluminum and calcium. The conducting layer may have a thickness in the range of 10 nm and 30 nm. As shown in FIG. 6E, a conducting layer 620 is provided on the additional layer 626 of gate metal. The conducting layer 620 may help to reduce gate resistance and improve performance of the resulting IC device.

Figure 7:
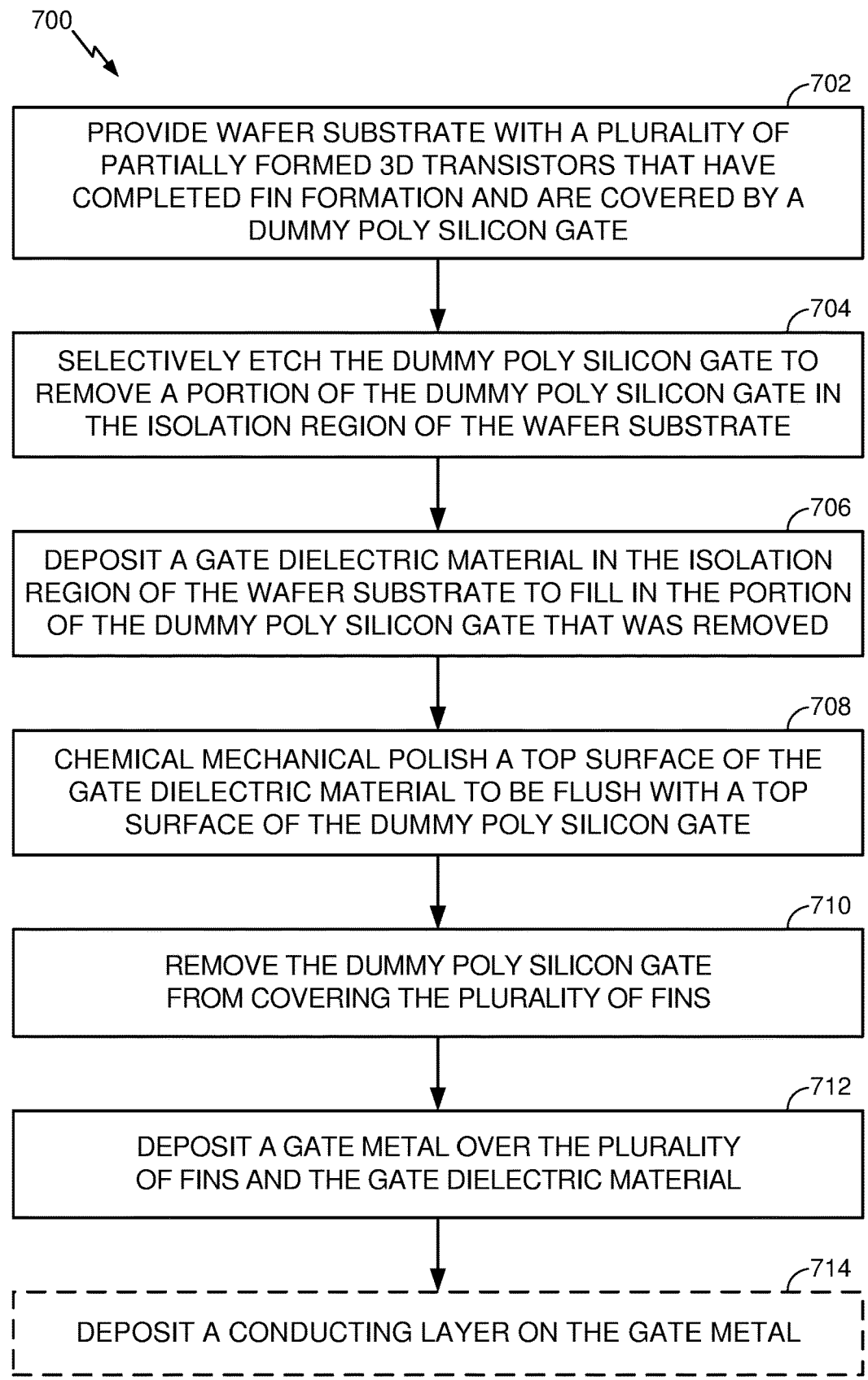
FIG. 7 illustrates another process flow diagram of a method for fabricating an IC device, according to aspects of the present disclosure.
Figure 8A:
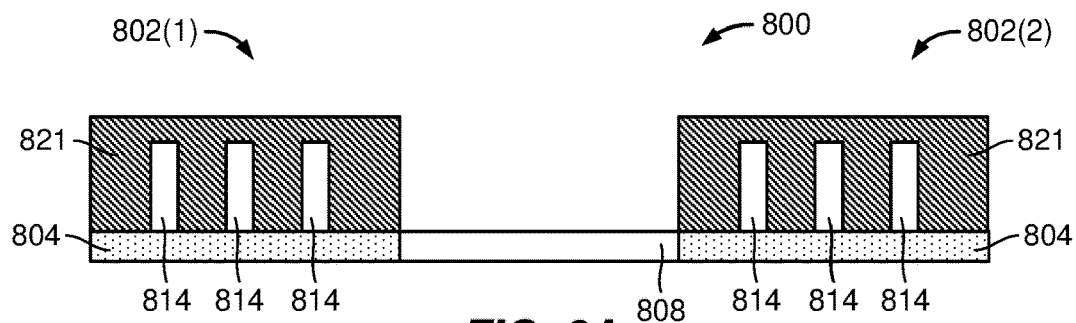
FIGS. 8A-8E illustrate another fabrication process for fabricating an IC device, according to aspects of the present disclosure.

FIG. 7 provides a process flow diagram of another method 700 for fabricating an IC device, according to aspects of the present disclosure. The process flow diagram of FIG. 7 may be supplemented by the fabrication process illustrations of FIGS. 8A-8E. At block 702 a wafer substrate having a plurality of partially formed 3D FinFET transistors that have completed fin formation and are covered by a dummy poly silicon gate is provided. At block 704, the dummy poly silicon gate may be etched to remove a portion of the dummy poly silicon gate in an isolation region of the wafer substrate. As illustrated in FIG. 8A, a wafer substrate 800 may have partially formed 3D transistors 802(1), 802(2) formed thereon. The partially formed 3D transistors 802(1), 802(2) are each formed on a diffusion region 804 of the wafer substrate 800, and each of the partially formed 3D transistors 802(1), 802(2) includes a plurality of fins 814. The diffusion regions 804 of the wafer substrate 800 are separated from each other by an isolation region 808 of the wafer substrate 800. The wafer substrate 800 has completed fin formation and the fins 814 are covered by a dummy poly silicon gate 821. A portion of the dummy poly silicon gate 821 has been removed from the isolation region 808 of the wafer substrate 800.

Figure 8B:
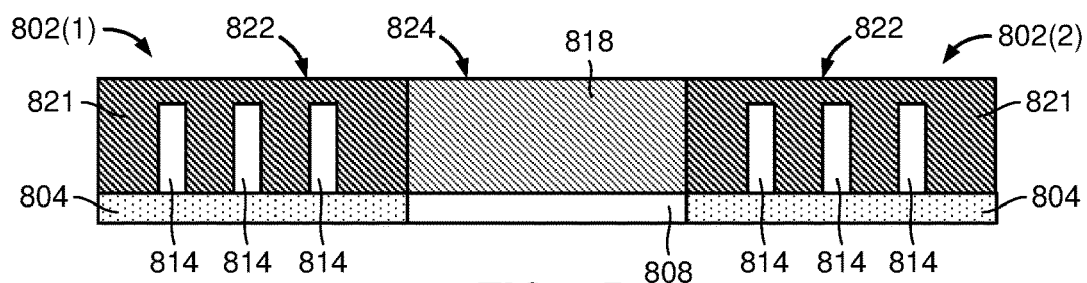

At block 706 of FIG. 7, a gate dielectric material may be deposited in the isolation region of the wafer substrate to fill in the portion of the dummy poly silicon gate that was removed. At block 708 the gate dielectric material is chemical mechanically polished so that a top surface of the gate dielectric material is flush with a top surface of the dummy poly silicon gate. As shown in FIG. 8B, a gate dielectric material 818 is provided in the isolation region 808 of the wafer substrate 800, where the dummy poly silicon gate 821 was removed. The gate dielectric material 818 has been polished, such that a top surface 824 of the gate dielectric material 818 is flush with a top surface 822 of the dummy poly silicon gate 821. The gate dielectric material 818 may have at thickness in the range of 40 nm to 60 nm. As noted earlier, the gate dielectric material 818 may be a silicon nitride or any other suitable dielectric material.

Figure 8C:
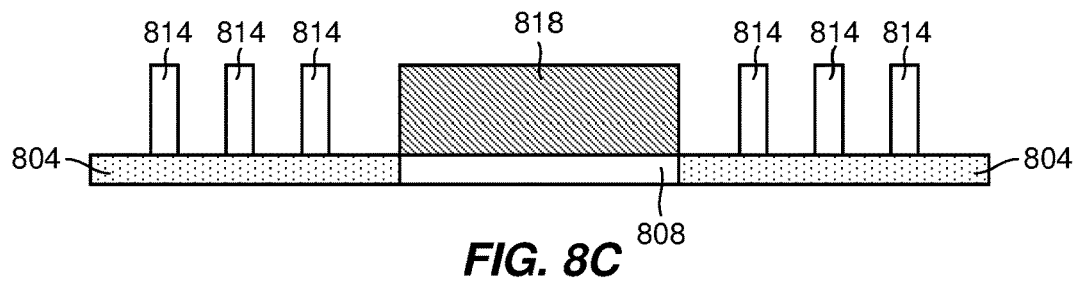

At block 710 of FIG. 7, the dummy poly silicon gate may be removed using a lithography mask to pattern and etch out the dummy poly silicon gate. FIG. 8C shows the wafer substrate 800 with the dummy poly silicon gate removed and the plurality of fins 814 exposed.

Figure 8D:
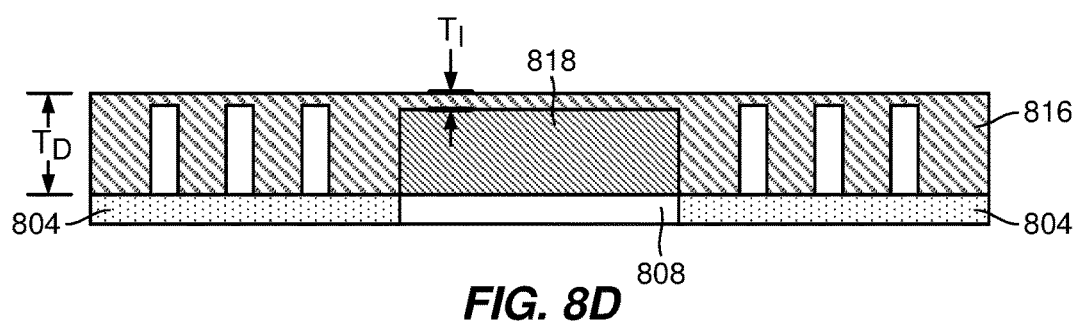

At block 712 of FIG. 7, a gate metal may be deposited over the plurality of fins in the diffusion region and over the gate dielectric material in the isolation region. The gate metal may also be polished to smooth its surface. FIG. 8D illustrates a gate metal 816 covering the fins 814 in the diffusion regions 804 of the wafer substrate 800 as well as covering the gate dielectric material 818 in the isolation region 808. After the gate metal 816 has been polished, a thickness of the gate metal 816 in the isolation region 808 is less than a maximum thickness of the gate metal 816 in the diffusion region 804. The maximum thickness $T_D$ of the gate metal 816 in the diffusion region may be in the range of 50 nm to 80 nm, while the thickness of the gate metal 816 in the isolation region 808 may vary, depending on whether or not the gate will include an optional conducting layer on top of the gate metal 816. If no conducting layer will be added to the gate, then, in the isolation region 808, the gate metal 816 may have a thickness $T_I$ in the range of 10 nm to 35 nm. If a conducting layer will be added to the gate, the thickness $T_I$ may be in the range of 1 nm to 5 nm.

Figure 8E:
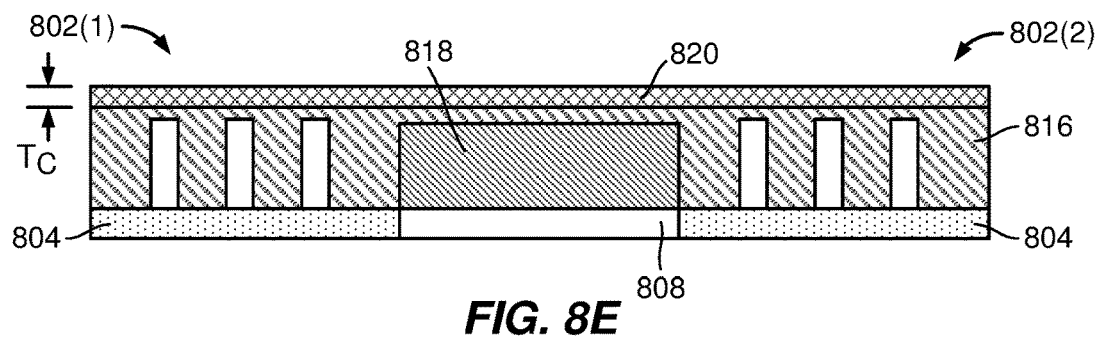

At block 714 of FIG. 7, an optional conducting layer may be deposited on the gate metal. The conducting material may be either deposited or grown on the top of the gate material in both the diffusion and isolation regions to form a conducting path of the gate. The conducting layer is preferably composed of material having a higher conductivity than that the gate metal. For example, if the gate metal is composed of tungsten or cobalt, the conducting layer may be composed of a carbon material, such as graphene. Other suitable materials for the conducting layer that have a higher conductivity than tungsten or cobalt include silver, copper, gold, aluminum and calcium. The conducting layer may have a thickness $T_C$ in the range of 10 nm to 30 nm. As shown in FIG. 8E, a conducting layer 820 is provided on the gate metal 816. The conducting layer 820 may help to reduce gate resistance and improve performance of the resulting IC device.

Figure 9:
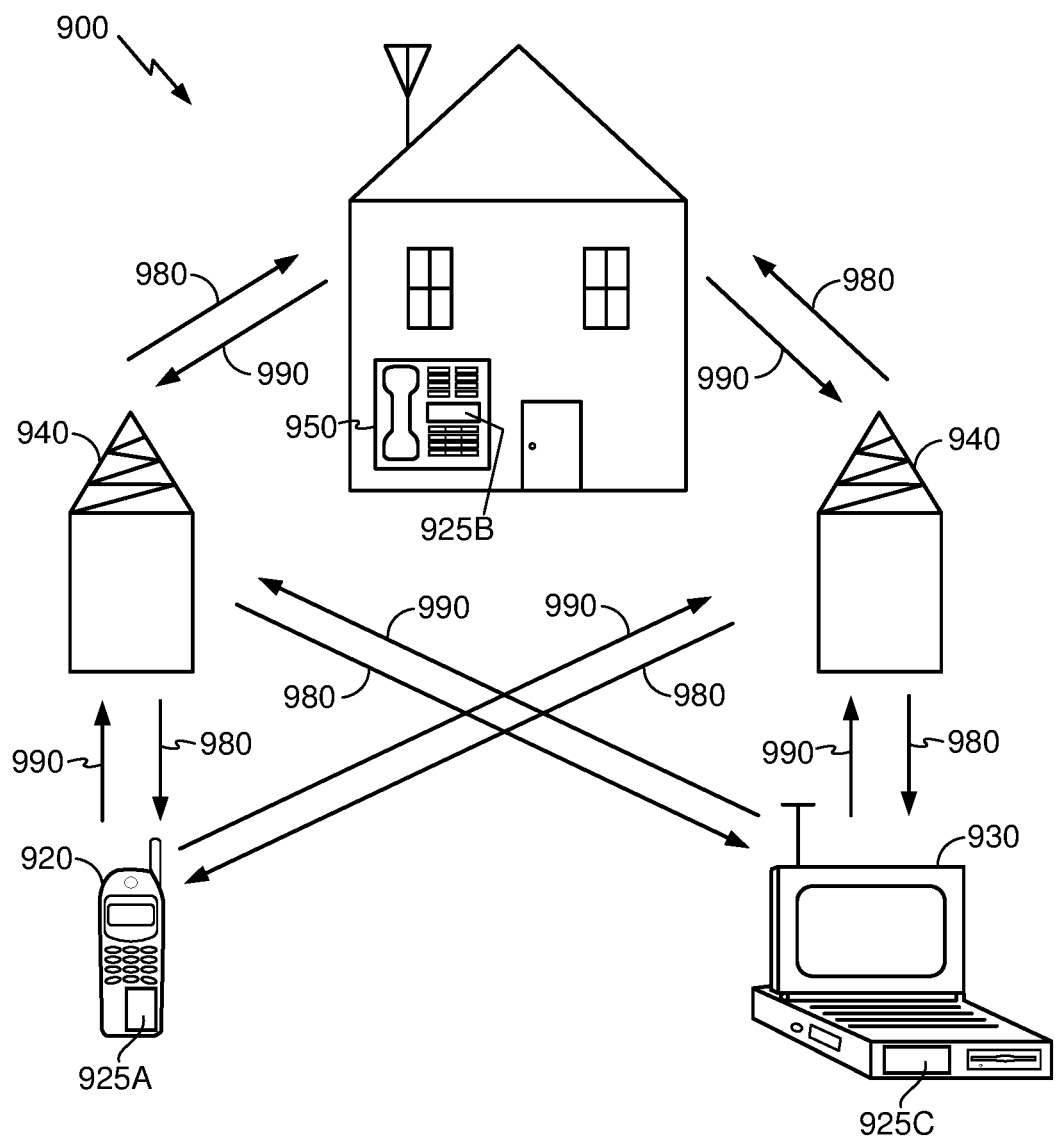
FIG. 9 is a block diagram showing an exemplary wireless communication system in which an aspect of the disclosure may be advantageously employed.

FIG. 9 is a block diagram showing an exemplary wireless communication system 900 in which an aspect of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925C, and 925B that include the disclosed IC devices. It will be recognized that other devices may also include the disclosed IC devices, such as the base stations, switching devices, and network equipment. FIG. 9 shows forward link signals 980 from the base station 940 to the remote units 920, 930, and 950 and reverse link signals 990 from the remote units 920, 930, and 950 to base stations 940.

In FIG. 9, remote unit 920 is shown as a mobile telephone, remote unit 930 is shown as a portable computer, and remote unit 950 is shown as a fixed location remote unit in a wireless local loop system. For example, the remote units may be a mobile phone, a hand-held personal communication systems (PCS) unit, a portable data unit such as a personal data assistant, a GPS enabled device, a navigation device, a set top box, a music player, a video player, an entertainment unit, a fixed location data unit such as a meter reading equipment, or other devices that store or retrieve data or computer instructions, or combinations thereof. Although FIG. 9 illustrates remote units according to the aspects of the disclosure, the disclosure is not limited to these exemplary illustrated units. Aspects of the disclosure may be suitably employed in many devices, which include the disclosed IC devices.

Figure 10:
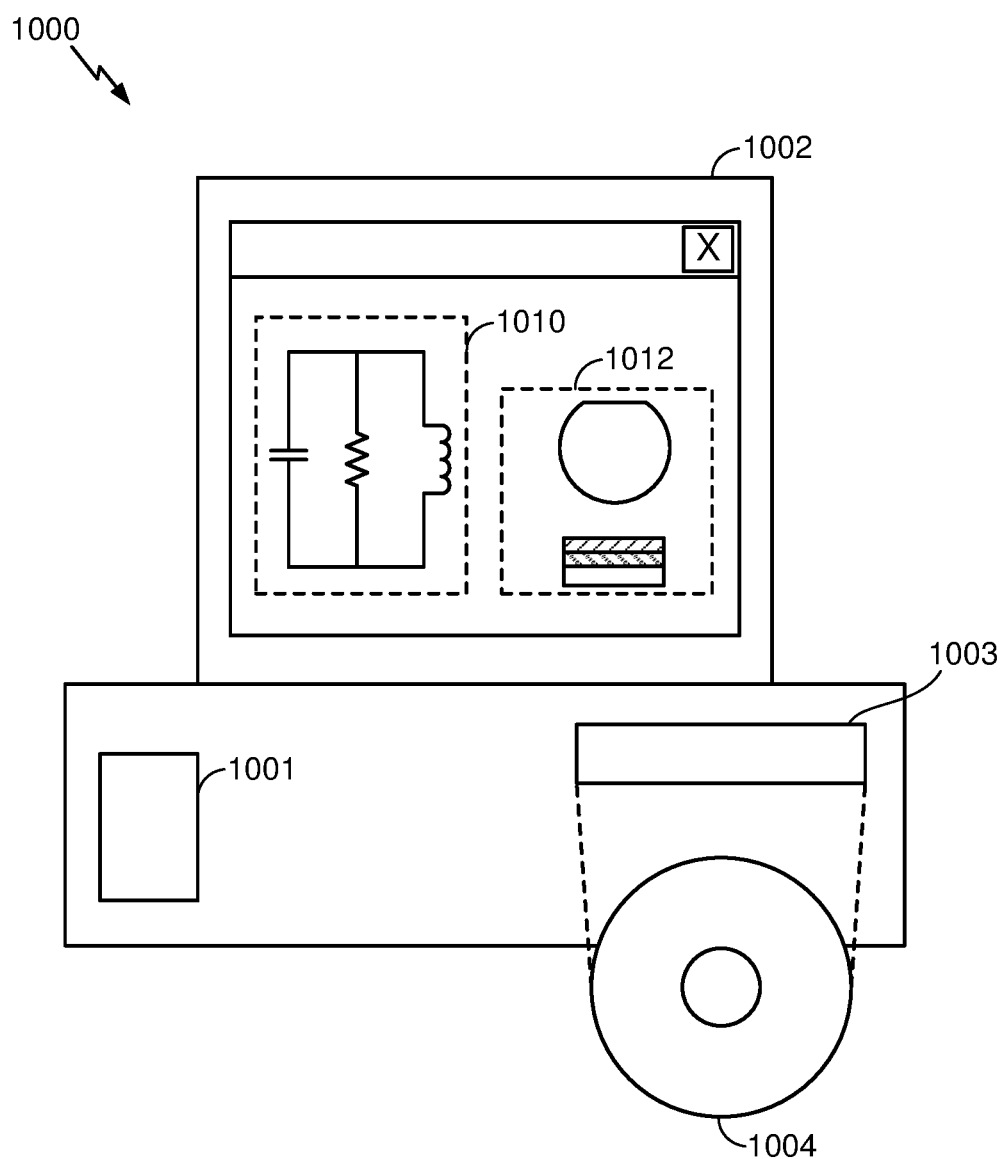
FIG. 10 is a block diagram illustrating a design workstation used for circuit, layout, and logic design of an IC device according to one configuration.

FIG. 10 is a block diagram illustrating a design workstation used for circuit, layout, and logic design of the IC devices disclosed above. A design workstation 1000 includes a hard disk 1001 containing operating system software, support files, and design software such as Cadence or OrCAD. The design workstation 1000 also includes a display 1002 to facilitate design of a circuit 1010 or a IC device 1012. A storage medium 1004 is provided for tangibly storing the design of the circuit 1010 or the IC device 1012. The design of the circuit 1010 or the IC device 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit 1010 or the IC device 1012 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An integrated circuit, comprising:
    a substrate;
    a first three-dimensional (3D) transistor formed on a first diffusion region of the substrate, the first 3D transistor including a first source, a first drain, a plurality of first fins, and a gate, the gate wrapped around the plurality of first fins and extending across the first diffusion region between the first source and the first drain;
    a second 3D transistor formed on a second diffusion region of the substrate, the second 3D transistor including a second source, a second drain, a plurality of second fins, and the gate wrapped around the plurality of second fins and extending across the second diffusion region between the second source and the second drain;
    wherein the gate extends from the first 3D transistor across an isolation region of the substrate to the second 3D transistor, the gate including a gate metal,
    wherein the gate metal has an isolation portion extending over the isolation region of the substrate and a diffusion portion extending over the first diffusion region and the second diffusion region; and
    a gate dielectric material having a top, a bottom, and sidewalls, the bottom of the gate dielectric material positioned in contact with a top surface of the substrate such that the bottom of the gate dielectric material does not extend into the substrate, the top of the gate dielectric material substantially co-planar with tops of the plurality of first fins and the plurality of second fins, the gate dielectric material positioned between the isolation portion of the gate metal and the substrate, the gate dielectric material positioned such that the isolation portion of the gate metal extends over the top and the sidewalls of the gate dielectric material, the isolation portion of the gate metal having a thickness less than a maximum thickness of the diffusion portion of the gate metal.

2. The integrated circuit of claim 1, wherein the gate dielectric material having a thickness in the range of 40 nm to 60 nm.

3. The integrated circuit of claim 1, wherein the thickness of the isolation portion of the gate metal is in the range of 10 nm to 35 nm.

4. The integrated circuit of claim 1, wherein the gate metal is composed of a material selected from the group consisting of cobalt and tungsten.

5. The integrated circuit of claim 1, wherein the gate further includes a conducting layer disposed on the gate metal.

6. The integrated circuit of claim 5, wherein the conducting layer has a thickness in the range of 10 nm to 30 nm.

7. The integrated circuit of claim 5, wherein the conducting layer is composed of a material selected from the group consisting of graphene, copper, aluminum, and gold.

8. The integrated circuit of claim 1, integrated into a mobile phone, a set top box, a music player, a video player, an entertainment unit, a navigation device, a computer, a hand-held personal communication systems (PCS) unit, a portable data unit, and/or a fixed location data unit.

* * * * *